United States Patent
Hidaka et al.

(10) Patent No.: US 9,142,771 B2
(45) Date of Patent: Sep. 22, 2015

(54) SUPERLATTICE PHASE CHANGE MEMORY DEVICE

(71) Applicant: KABUSHIKI KAISHA TOSHIBA, Minato-ku, Tokyo (JP)

(72) Inventors: Aoi Hidaka, Mie-ken (JP); Tsukasa Nakai, Mie-ken (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 109 days.

(21) Appl. No.: 14/017,050

(22) Filed: Sep. 3, 2013

(65) Prior Publication Data
US 2015/0008385 A1    Jan. 8, 2015

(30) Foreign Application Priority Data

Jul. 3, 2013  (JP) ................... 2013-140077

(51) Int. Cl.
*H01L 45/00*    (2006.01)
(52) U.S. Cl.
CPC .............. *H01L 45/144* (2013.01); *H01L 45/08* (2013.01); *H01L 45/1233* (2013.01)
(58) Field of Classification Search
None
See application file for complete search history.

(56) References Cited

U.S. PATENT DOCUMENTS

| | | | | |
|---|---|---|---|---|
| 9,024,284 | B2 * | 5/2015 | Oyanagi et al. | 257/2 |
| 2009/0173930 | A1 | 7/2009 | Yasuda et al. | |
| 2009/0221146 | A1 | 9/2009 | Seko et al. | |
| 2010/0181548 | A1 * | 7/2010 | Tominaga et al. | 257/2 |
| 2010/0200828 | A1 | 8/2010 | Tominaga et al. | |
| 2010/0284218 | A1 * | 11/2010 | Aizawa et al. | 365/174 |
| 2011/0006277 | A1 * | 1/2011 | Kubo et al. | 257/2 |
| 2012/0063201 | A1 | 3/2012 | Hayakawa et al. | |
| 2013/0221310 | A1 * | 8/2013 | Morikawa et al. | 257/2 |
| 2014/0063924 | A1 * | 3/2014 | Nakai et al. | 365/158 |
| 2014/0241050 | A1 * | 8/2014 | Nakai et al. | 365/163 |
| 2015/0008388 | A1 * | 1/2015 | Kawasaki | 257/4 |

FOREIGN PATENT DOCUMENTS

| | | |
|---|---|---|
| JP | 2009-054901 A | 3/2009 |
| JP | 2009-141151 A | 6/2009 |

* cited by examiner

*Primary Examiner* — Andres Munoz
(74) *Attorney, Agent, or Firm* — Holtz, Holtz, Goodman & Chick PC

(57) ABSTRACT

According to one embodiment, a memory device includes a stacked film stacked in a superlattice structure. The stacked film includes a first layer, a second layer, and a third layer different in composition. The first layer is provided between the second layer and the third layer. The second layer includes a first atom reversibly moved by application of energy. The third layer includes a second atom reversibly moved by application of energy. The second atom is different from the first atom.

14 Claims, 10 Drawing Sheets

SUPERLATTICE PHASE CHANGE MEMORY DEVICE

CROSS-REFERENCE TO RELATED APPLICATION

This application is based upon and claims the benefit of priority from Japanese Patent Application No. 2013-140077, filed on Jul. 3, 2013; the entire contents of which are incorporated herein by reference.

FIELD

Embodiments described herein relate generally to a memory device.

BACKGROUND

As a new type of nonvolatile memory, a phase change memory utilizing the change of crystal states has been proposed. Furthermore, in order to improve the energy efficiency required for phase change, a phase change film of a superlattice structure has been proposed. With regard to such a new type of nonvolatile memory, multilevel operation and on/off ratio improvement have been less studied yet, and practical performance has not been achieved.

DETAILED DESCRIPTION

Figure 1:
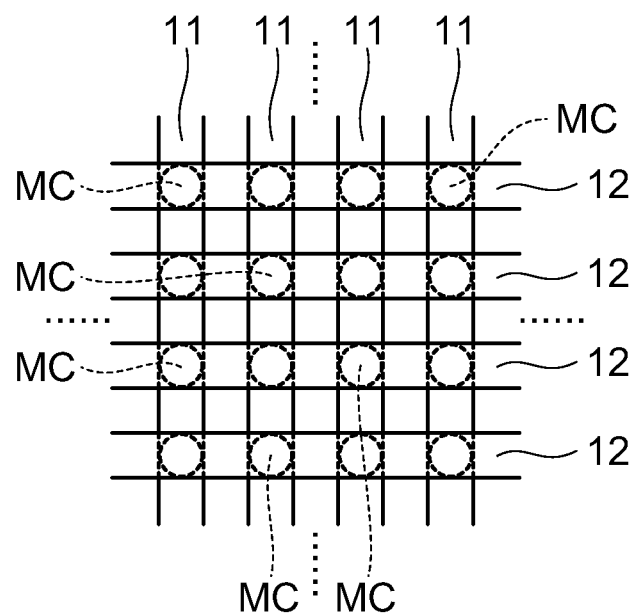
FIG. 1 is a schematic plan view of a semiconductor memory device of an embodiment.

According to one embodiment, a memory device includes a stacked film stacked in a superlattice structure. The stacked film includes a first layer, a second layer, and a third layer different in composition. The first layer is provided between the second layer and the third layer. The second layer includes a first atom reversibly moved by application of energy. The third layer includes a second atom reversibly moved by application of energy. The second atom is different from the first atom.

Embodiments will now be described with reference to the drawings. In the drawings, like elements are labeled with like reference numerals.

FIG. 1 is a schematic plan view of a semiconductor memory device of the embodiments.

The semiconductor memory device of the embodiments includes a plurality of first wirings 11 and a plurality of second wirings 12. Furthermore, the semiconductor memory device includes a memory cell MC provided between the first wiring 11 and the second wiring 12.

The first wiring 11 and the second wiring 12 cross each other in a non-parallel and three-dimensional manner. The first wiring 11 and the second wiring 12 are e.g. orthogonal to each other. At the cross-point of the first wiring 11 and the second wiring 12, a memory cell MC is provided in a columnar shape.

(First Embodiment)

Figure 2A:
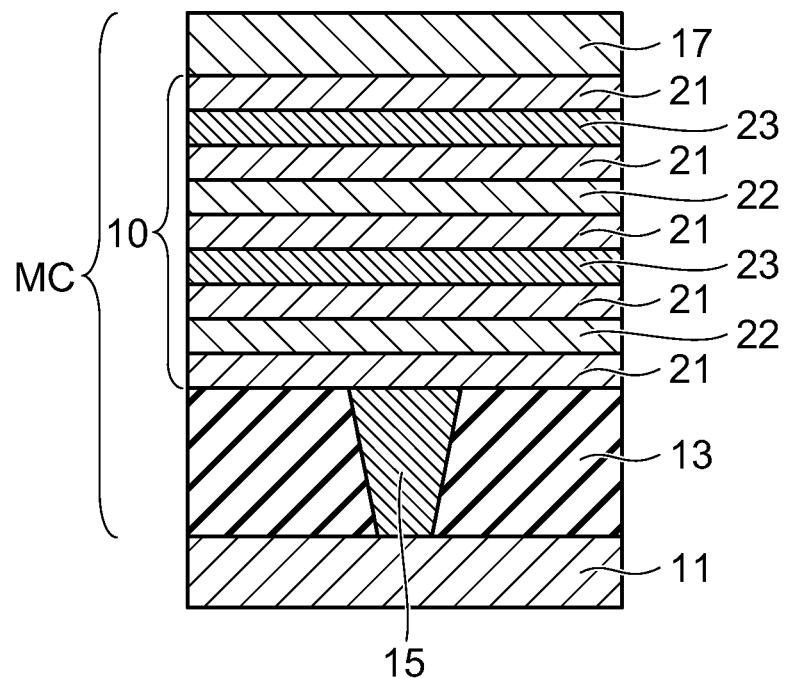
FIG. 2A is a schematic sectional view of a memory cell of a first embodiment.

FIG. 2A is a schematic sectional view of a memory cell MC of a first embodiment.

The memory cell MC includes a lower electrode 15, an upper electrode 17, and a stacked film 10 provided between the lower electrode 15 and the upper electrode 17.

The lower electrode 15 is provided on the first wiring 11. The second wiring 12 shown in FIG. 1 is provided on the upper electrode 17. A current is supplied to the stacked film 10 through the first wiring 11, the lower electrode 15, the upper electrode 17, and the second wiring 12.

The memory cell MC is shaped like e.g. a cylindrical column. Alternatively, the memory cell MC may be shaped like a prismatic column.

The lower electrode 15 is shaped like a column having a smaller planar size (diameter) than the stacked film 10 and the upper electrode 17. Between the first wiring 11 and the stacked film 10 around the lower electrode 15, an insulating film 13 is provided.

Thus, the planar size of the lower electrode 15 is made smaller than the planar size of the stacked film 10. This narrows the path of the current flowing vertically (in the stacking direction) in the stacked film 10. Thus, the current density of the current flowing vertically in the stacked film 10 can be increased.

The lower electrode 15 and the upper electrode 17 are made of a material including at least one of e.g. tungsten (W), tungsten nitride (WN), titanium (Ti), titanium nitride (TiN), titanium silicide nitride (TiSiN), tantalum (Ta), tantalum nitride (TaN), and tantalum silicide nitride (TaSiN).

The stacked film 10 includes a plurality of first layers 21, a plurality of second layers 22, and a plurality of third layers 23.

The first layer 21 is provided directly above the lower electrode 15 and in contact with the lower electrode 15. The first layer 21 is provided directly below the upper electrode 17 and in contact with the upper electrode 17. The first layer 21 is provided between the second layer 22 and the third layer 23.

The first layer 21, the second layer 22, and the third layer 23 are different in composition, but are all made of e.g. chalcogenide compounds including tellurium (Te).

The first layer 21 includes, in addition to tellurium, at least one of antimony (Sb) and bismuth (Bi). In the first embodiment, the first layer 21 is e.g. a $Sb_2Te_3$ layer.

The second layer 22 includes, in addition to tellurium, first atoms reversibly moved by application of energy (electrical energy). The first atom is at least one of e.g. germanium (Ge), aluminum (Al), gallium (Ga), indium (In), tin (Sn), zinc (Zn), silver (Ag), gold (Au), and copper (Cu). In the first embodiment, the second layer 22 is e.g. a GeTe layer.

The third layer 23 includes, in addition to tellurium, second atoms reversibly moved by application of energy. The second atom is at least one of e.g. germanium, aluminum, gallium, indium, tin, zinc, silver, gold, and copper. However, the second atom is different from the first atom included in the second layer 22. In the first embodiment, the third layer 23 is e.g. an AlTe layer.

The first layer 21, the second layer 22, and the third layer 23 are stacked in a superlattice structure. The superlattice is a crystal lattice in which its periodic structure is made longer than that of the basic unit lattice by superposition of a plurality of kinds of crystal lattices.

In the first layer ($Sb_2Te_3$ layer) 21, the C-axis of the hexagonal crystal is oriented in the stacking direction. The second layer (GeTe layer) 22 and the third layer (AlTe layer) 23 are cubic crystals equivalent to the NaCl structure. The stacking surface of the second layer (GeTe layer) 22 and the third layer (AlTe layer) 23 with respect to the first layer ($Sb_2Te_3$ layer) 21 is (111)-oriented.

The second layers 22 and the third layers 23 are alternately stacked with the first layer 21 interposed therebetween. The first layer 21 functions as a barrier layer for preventing interdiffusion of the first atoms (Ge) of the second layer 22 and the second atoms (Al) of the third layer 23.

The stacked film 10 is electrically switchable to a low resistance state, a medium resistance state having a higher resistance value than the low resistance state, and a high resistance state having a higher resistance value than the medium resistance state. The stacked film 10 stores data in a nonvolatile manner. That is, the stacked film 10 is capable of multilevel recording.

Figure 2B:
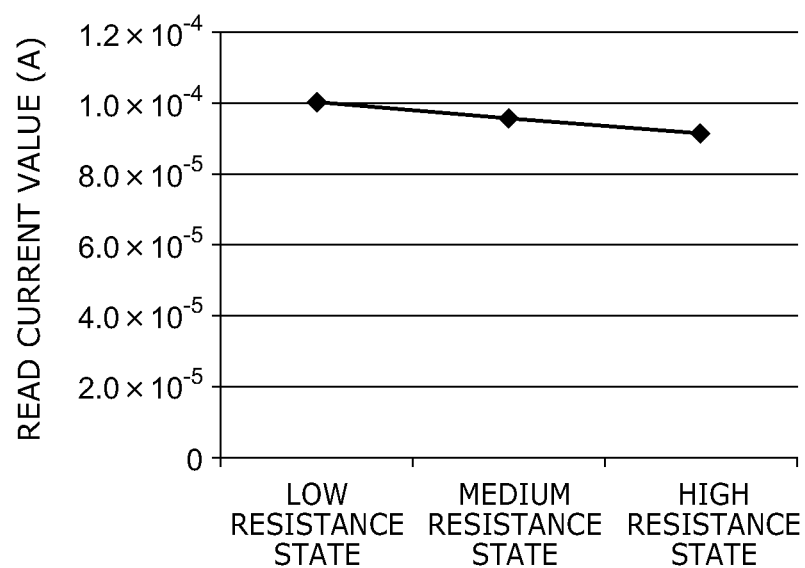
FIG. 2B is a graph showing a relationship between a phase change and a read current value in the memory cell of the first embodiment.

FIG. 2B is a graph showing the relationship between the phase change (resistance change) and the read current value (A) in the memory cell MC of the first embodiment. The resistance state on the horizontal axis represents the resistance state of the entire stacked film 10.

The first layer 21, the second layer 22, and the third layer 23 have the same planar size and film thickness. The planar size is a size in the direction perpendicular to the stacking direction. In the first embodiment, the stacked film 10 including the first layer 21, the second layer 22, and the third layer 23 is shaped like a cylindrical column. Thus, the planar size of the stacked film 10 corresponds to the diameter. The diameter of the stacked film 10 is 100 nm.

The resistivity of the second layer 22 is made higher in the medium resistance state than in the low resistance state by first energy applied in the low resistance state.

The resistivity of the third layer 23 is not substantially changed by application of the above first energy. The resistivity of the third layer 23 is made higher in the high resistance state than in the medium resistance state by second energy applied in the medium resistance state.

The first layer 21 does not include atoms moved by energy application. Thus, the resistivity of the first layer 21 is not substantially changed among the low resistance state, the medium resistance state, and the high resistance state. In the low resistance state, the resistivity of the second layer 22 is higher than the resistivity of the third layer 23.

The resistivity of the first layer 21, the second layer 22, and the third layer 23 in each resistance state was set to the following value to calculate the read current value shown in FIG. 2B.

In the low resistance state, the resistivity of the first layer 21 is $1.0\times10^{-4}$ Ω·m, the resistivity of the second layer 22 is $1.0\times10^{-4}$ Ω·m, and the resistivity of the third layer 23 is $9.0\times10^{-5}$ Ω·m.

In the medium resistance state, the resistivity of the first layer 21 is $1.0\times10^{-4}$ Ω·m, the resistivity of the second layer 22 is $1.0\times10^{-1}$ Ω·m, and the resistivity of the third layer 23 is $9.0\times10^{-5}$ Ω·m.

In the high resistance state, the resistivity of the first layer 21 is $1.0\times10^{-4}$ Ω·m, the resistivity of the second layer 22 is $1.0\times10^{-1}$ Ω·m, and the resistivity of the third layer 23 is $1.0\times10^{-1}$ Ω·m.

In the low resistance state, the first layer 21, the second layer 22, and the third layer 23 are all in the crystal state. To the stacked film 10 in this low resistance state, as the first energy, for instance, a pulse voltage of 0.1 V is applied for 0.1 μsec.

By this application of the first energy, the first atoms (Ge) of the second layer 22 are moved. That is, by application of the first energy, the lattice position of the first atoms (Ge) in the crystal is changed.

In the case of a chalcogenide compound composed primarily of Ge and Te, by application of energy, the position of Te is not substantially changed, but the position of Ge is changed. Before and after the change (movement) of the position of Ge, there is no substantial difference in the energy stability of the crystal. Thus, Ge is easy to move reversibly.

By the movement of the first atoms (Ge) of the second layer 22 by this application of the first energy, the resistivity of the second layer 22 increases, and the resistance value of the entire stacked film 10 increases. That is, by the increase of the resistivity of the second layer 22 by application of the first energy in the low resistance state, the stacked film 10 is changed from the low resistance state to the medium resistance state.

In this application of the first energy, the resistivity of the first layer 21 and the third layer 23 is not substantially changed. That is, the change of the stacked film 10 from the low resistance state to the medium resistance state depends on the change (increase) of the resistivity of the second layer 22.

To the stacked film 10 in the medium resistance state, furthermore, as the second energy, for instance, a pulse voltage of 0.2 V is applied for 0.1 μsec. Then, the stacked film 10 is changed to the high resistance state.

By this application of the second energy, the second atoms (Al) of the third layer 23 are moved. That is, by application of the second energy, the lattice position of the second atoms (Al) in the crystal is changed.

By the movement of the second atoms (Al) of the third layer 23 by this application of the second energy, the resistivity of the third layer 23 increases, and the resistance value of the entire stacked film 10 increases. That is, by the increase of the resistivity of the third layer 23 by application of the second energy in the medium resistance state, the stacked film 10 is changed from the medium resistance state to the high resistance state.

The chalcogenide compound composed primarily of Al and Te assumes a cubic crystal structure like the GeTe layer. In this chalcogenide compound, the position of Al is changed by energy application.

According to the result of first principle band calculation, the resistivity of AlTe is lower than the resistivity of GeTe in the low resistance state. Thus, Ge can be moved with smaller energy than Al is moved. Thus, by energy application in the low resistance state, the second layer 22 is subjected to phase change earlier than the third layer 23.

Before application of the second energy, the first atoms (Ge) of the second layer 22 had been moved from the position of the low resistance state to the position of the medium resistance state. The Ge atoms are scarcely moved from the position of the medium resistance state by application of the second energy. Thus, by application of the second energy, the resistivity of the second layer 22 is not substantially changed.

Sb and Te of the first layer 21 are not moved by energy application. Thus, the resistivity of the first layer 21 is also not substantially changed by application of the second energy. Thus, the change of the stacked film 10 from the medium resistance state to the high resistance state depends on the change (increase) of the resistivity of the third layer 23.

According to the embodiment, the stacked film 10 subjected to phase change (change of resistivity) has a superlattice structure. Thus, the movement direction of the reversibly moved atoms can be aligned between two states. This can improve the energy efficiency for movement of atoms, i.e., phase change. Thus, a nonvolatile semiconductor memory device capable of low current operation can be provided.

Furthermore, the embodiment can provide a nonvolatile semiconductor memory device capable of multilevel (in the embodiment, for instance, three-level) recording by a plurality of switching layers (second layer 22, third layer 23) allowing change (increase) of resistivity at timings different from each other.

The phase change (change of resistivity) of the switching layers (second layer 22, third layer 23) is reversible. Thus, by energy application, the switching layers can be returned from the high resistance state to the medium resistance state or the low resistance state.

Here, multilevel recording in four or more levels is also possible by using a stacked film including three or more switching layers allowing change of resistivity at timings different from each other.

(Second Embodiment)

Figure 3A:
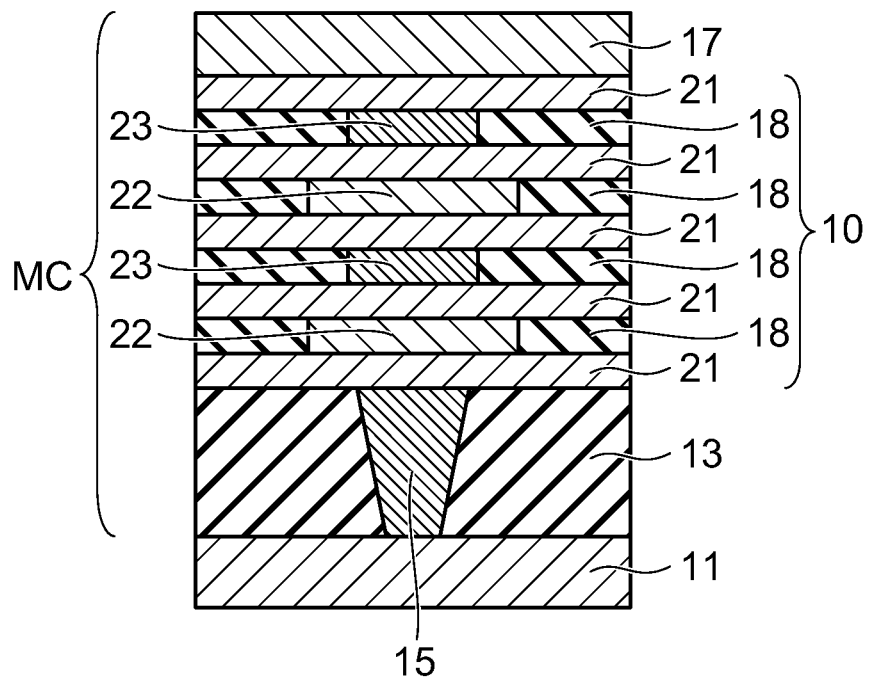
FIG. 3A is a schematic sectional view of a memory cell of a second embodiment.

FIG. 3A is a schematic sectional view of a memory cell MC of a second embodiment.

In the second embodiment, the planar size (diameter) of the second layer 22 and the planar size (diameter) of the third layer 23 are smaller than the planar size (diameter) of the first layer 21. The remaining configuration is the same as that of the first embodiment.

Furthermore, the planar size of the third layer 23 is smaller than the planar size of the second layer 22. The center in the in-plane direction (diameter direction) of each of the first layer 21, the second layer 22, and the third layer 23 is located above the lower electrode 15.

Between the first layer 21 and the first layer 21 around the second layer 22, an insulating film 18 is provided. Also between the first layer 21 and the first layer 21 around the third layer 23, an insulating film 18 is provided.

The stacked film 10 in this second embodiment is also electrically switchable to a low resistance state, a medium resistance state having a higher resistance value than the low resistance state, and a high resistance state having a higher resistance value than the medium resistance state. The stacked film 10 stores data in a nonvolatile manner. That is, the memory cell MC of the second embodiment is also capable of multilevel recording.

Figure 3B:
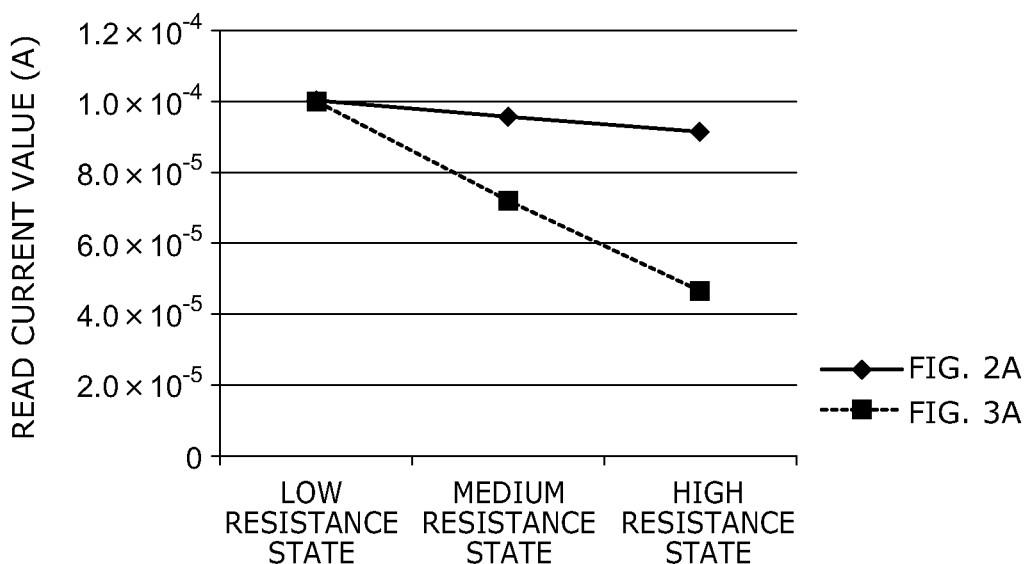
FIG. 3B is a graph showing a relationship between a phase change and a read current value in the memory cell of the second embodiment.

FIG. 3B is a graph showing the relationship between the phase change (resistance change) and the read current value (A) in the memory cell MC of the second embodiment. The resistance state on the horizontal axis represents the resistance state of the entire stacked film 10.

In FIG. 3B, the resistance change characteristic of the structure of the second embodiment shown in FIG. 3A is shown in comparison with the resistance change characteristic of the structure of the first embodiment shown in FIG. 2A.

In the second embodiment, the diameter of the first layer ($Sb_2Te_3$ layer) 21 is 100 nm. The diameter of the second layer (GeTe layer) 22 is 35 nm. The diameter of the third layer (AlTe layer) 23 is 25 nm. The first layer 21, the second layer 22, and the third layer 23 have the same film thickness.

Also in the second embodiment, the resistivity of the first layer 21, the second layer 22, and the third layer 23 in each resistance state was set to the same value as in the above first embodiment to calculate the read current value shown in FIG. 3B.

The reduction of the planar size of the second layer 22 and the third layer 23 narrows the current path along the vertical direction (stacking direction) of the stacked film 10.

However, in the low resistance state, the first layer 21, the second layer 22, and the third layer 23 are all in the crystal state, and have a sufficiently low resistivity.

Thus, the reduction of the planar size of the second layer 22 and the third layer 23 to the extent specifically listed above by numerical values does not substantially affect the resistance value of the entire stacked film 10 of the low resistance state. That is, in the low resistance state, the resistance value of the stacked film 10 of the second embodiment is substantially equal to that of the first embodiment (FIG. 2B) in which the planar size of the second layer 22 and the third layer 23 is equal to the planar size of the first layer 21.

To the stacked film 10 in this low resistance state, as the first energy, for instance, a pulse voltage of 0.1 V is applied for 0.1 μsec. Then, as in the first embodiment, the first atoms (Ge) of the second layer 22 are moved. That is, by application of the first energy, the lattice position of the first atoms (Ge) in the crystal is changed.

By the movement of Ge of the second layer 22 by this application of the first energy, the resistivity of the second layer 22 increases, and the resistance value of the entire stacked film 10 increases. That is, by the increase of the resistivity of the second layer 22 by application of the first energy in the low resistance state, the stacked film 10 is changed from the low resistance state to the medium resistance state.

In this application of the first energy, the resistivity of the first layer 21 and the third layer 23 is not substantially changed. That is, the change of the stacked film 10 from the low resistance state to the medium resistance state depends on the change (increase) of the resistivity of the second layer 22.

In the change from the low resistance state to the medium resistance state, only the resistivity of the second layer 22 increases. When the resistivity of the second layer 22 increases to the resistivity of the medium resistance state, the reduction of the planar size of the second layer 22 starts to affect the resistance value of the entire stacked film 10.

That is, as shown in FIG. 3B, in the second embodiment, in the medium resistance state, the resistance value of the stacked film 10 is higher, and the read current value is lower, than in the first embodiment.

Thus, in the memory cell MC of the second embodiment, the difference in the read current value between the low resistance state and the medium resistance state is larger than in the first embodiment. Accordingly, data misread is less likely to occur.

To the stacked film 10 in the medium resistance state, furthermore, as the second energy, for instance, a pulse voltage of 0.2 V is applied for 0.1 μsec. Then, the second atoms (Al) of the third layer 23 are moved. That is, by application of the second energy, the lattice position of the second atoms (Al) in the crystal is changed.

By the movement of Al of the third layer 23 by this application of the second energy, the resistivity of the third layer 23 increases, and the resistance value of the entire stacked film 10 increases. That is, by the increase of the resistivity of the third layer 23 by application of the second energy in the medium resistance state, the stacked film 10 is changed from the medium resistance state to the high resistance state.

Thus, the second embodiment can also provide a nonvolatile semiconductor memory device capable of multilevel recording by a plurality of switching layers (second layer 22, third layer 23) allowing change (increase) of resistivity at timings different from each other.

As in the first embodiment, in the change from the medium resistance state to the high resistance state, only the resistivity of the third layer 23 increases. That is, the change of the stacked film 10 from the medium resistance state to the high resistance state depends on the change (increase) of the resistivity of the third layer 23. When the resistivity of the third layer 23 increases to the resistivity of the high resistance state, the reduction of the planar size of the third layer 23 starts to affect the resistance value of the entire stacked film 10.

That is, as shown in FIG. 3B, in the second embodiment, in the high resistance state, the resistance value of the stacked film 10 is higher, and the read current value is lower, than in the first embodiment. Thus, in the memory cell MC of the second embodiment, the difference in the read current value between the medium resistance state and the high resistance state, and the difference in the read current value between the low resistance state and the high resistance state, are larger than in the first embodiment. Accordingly, data misread is less likely to occur.

Here, the low resistance state of the stacked film 10 is regarded as on-state (or set state), and the high resistance state is regarded as off-state (or reset state). Then, according to the second embodiment, the on/off ratio can be made approximately 6.1 times as high as that of the first embodiment.

The change of the stacked film 10 from the medium resistance state to the high resistance state depends on the increase of the resistivity of the third layer 23. In the change from the medium resistance state to the high resistance state, the resistivity of the second layer 22 is not substantially changed.

Thus, the read current value of the high resistance state can be controlled by the planar size of the third layer 23. The reduction of the planar size of the third layer 23 increases the resistance value of the third layer 23. Thus, as the planar size of the third layer 23 is made smaller, the read current value of the high resistance state can be made smaller, and the on/off ratio can be expanded.

Furthermore, the change of the stacked film 10 from the low resistance state to the medium resistance state depends on the increase of the resistivity of the second layer 22. In the change from the low resistance state to the medium resistance state, the resistivity of the third layer 23 is not substantially changed.

Thus, the read current value of the medium resistance state can be controlled by the planar size of the second layer 22. The reduction of the planar size of the second layer 22 increases the resistance value of the second layer 22. Thus, the reduction of the planar size of the second layer 22 shifts the read current value of the medium resistance state to the high resistance state side. The expansion of the planar size of the second layer 22 shifts the read current value of the medium resistance state to the low resistance state side.

Depending on the combination (combination of film species) of a plurality of switching layers (second layer 22, third layer 23), there may be a case where a sufficient multilevel margin cannot be obtained. Even in this case, according to the second embodiment, without changing the film species (resistivity) of the switching layers, the multilevel margin can be appropriately controlled by controlling the planar size.

(Third Embodiment)

Figure 4A:
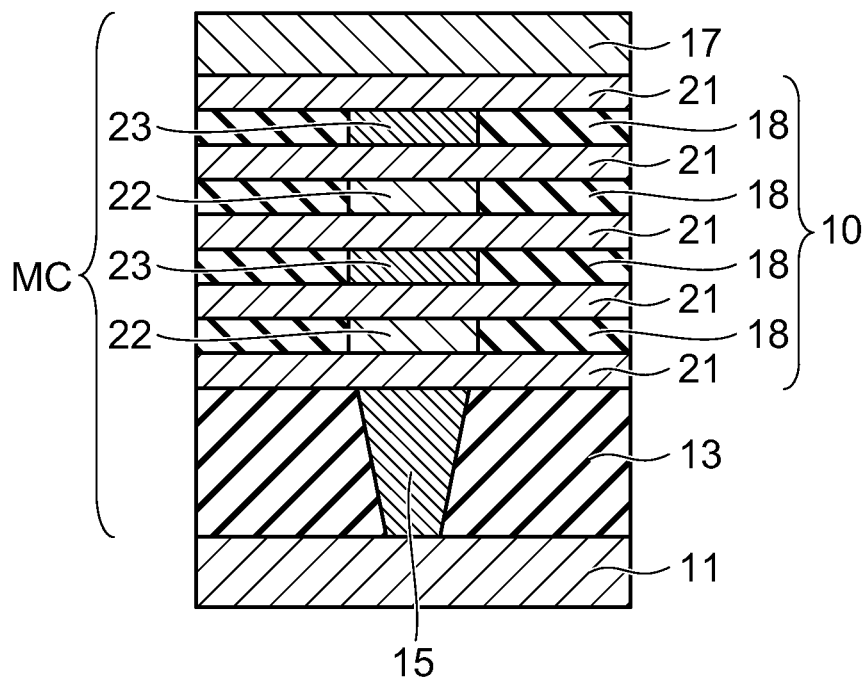
FIG. 4A is a schematic sectional view of a memory cell of a third embodiment.

FIG. 4A is a schematic sectional view of a memory cell MC of a third embodiment.

Also in the third embodiment, the planar size (diameter) of the second layer 22 and the planar size (diameter) of the third layer 23 are smaller than the planar size (diameter) of the first layer 21. The remaining configuration is the same as that of the first embodiment.

Furthermore, in the third embodiment, the planar size of the second layer 22 is equal to the planar size of the third layer 23. The center in the in-plane direction (diameter direction) of each of the first layer 21, the second layer 22, and the third layer 23 is located above the lower electrode 15.

Between the first layer 21 and the first layer 21 around the second layer 22, an insulating film 18 is provided. Also between the first layer 21 and the first layer 21 around the third layer 23, an insulating film 18 is provided.

The stacked film 10 in this third embodiment is also electrically switchable to a low resistance state, a medium resistance state having a higher resistance value than the low resistance state, and a high resistance state having a higher resistance value than the medium resistance state. The stacked film 10 stores data in a nonvolatile manner. That is, the memory cell MC of the third embodiment is also capable of multilevel recording.

Figure 4B:
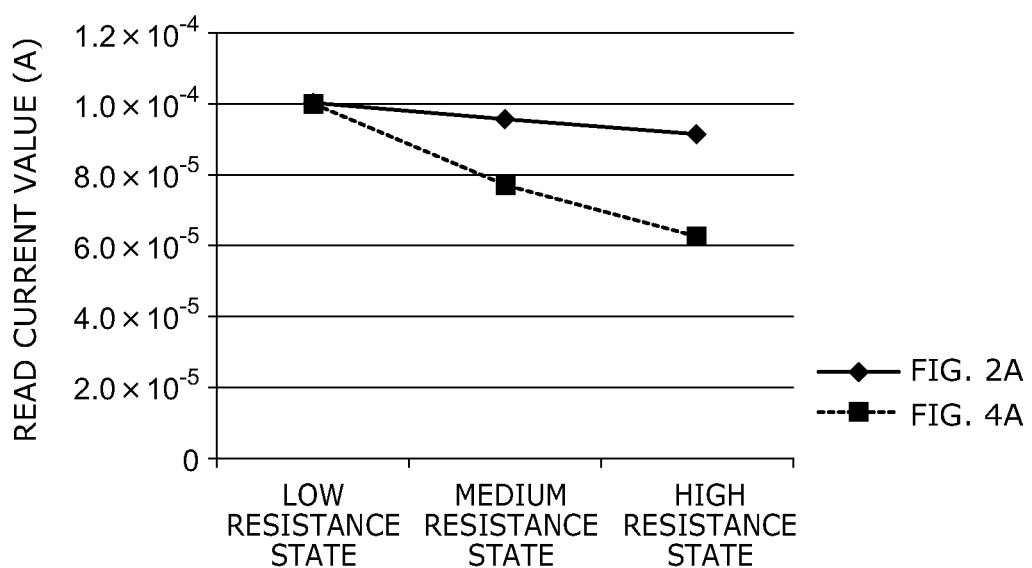
FIG. 4B is a graph showing a relationship between a phase change and a read current value in the memory cell of the third embodiment.

FIG. 4B is a graph showing the relationship between the phase change (resistance change) and the read current value (A) in the memory cell MC of the third embodiment. The resistance state on the horizontal axis represents the resistance state of the entire stacked film 10.

In FIG. 4B, the resistance change characteristic of the structure of the third embodiment shown in FIG. 4A is shown in comparison with the resistance change characteristic of the structure of the first embodiment shown in FIG. 2A.

In the third embodiment, the diameter of the first layer ($Sb_2Te_3$ layer) 21 is 100 nm. The diameter of the second layer (GeTe layer) 22 and the diameter of the third layer (AlTe layer) 23 are 40 nm. The first layer 21, the second layer 22, and the third layer 23 have the same film thickness.

Also in the third embodiment, the resistivity of the first layer 21, the second layer 22, and the third layer 23 in each resistance state was set to the same value as in the above first embodiment to calculate the read current value shown in FIG. 4B.

Also in the third embodiment, as in the second embodiment, the reduction of the planar size of the second layer 22 and the third layer 23 to the extent specifically listed above by numerical values does not substantially affect the resistance value of the entire stacked film 10 in the low resistance state.

That is, in the low resistance state, the resistance value of the stacked film 10 of the third embodiment is substantially equal to that of the first embodiment (FIG. 2B) in which the planar size of the second layer 22 and the third layer 23 is equal to the planar size of the first layer 21.

To the stacked film 10 in this low resistance state, as the first energy, for instance, a pulse voltage of 0.1 V is applied for 0.1 μsec. Then, as in the above embodiments, the first atoms (Ge) of the second layer 22 are moved. That is, by application of the first energy, the lattice position of the first atoms (Ge) in the crystal is changed.

By the movement of Ge of the second layer 22 by this application of the first energy, the resistivity of the second layer 22 increases, and the resistance value of the entire stacked film 10 increases. That is, by the increase of the resistivity of the second layer 22 by application of the first energy in the low resistance state, the stacked film 10 is changed from the low resistance state to the medium resistance state.

In this application of the first energy, the resistivity of the first layer 21 and the third layer 23 is not substantially changed. That is, the change of the stacked film 10 from the low resistance state to the medium resistance state depends on the change (increase) of the resistivity of the second layer 22.

In the change from the low resistance state to the medium resistance state, only the resistivity of the second layer 22 increases. When the resistivity of the second layer 22 increases to the resistivity of the medium resistance state, the reduction of the planar size of the second layer 22 starts to affect the resistance value of the entire stacked film 10.

That is, as shown in FIG. 4B, in the third embodiment, in the medium resistance state, the resistance value of the stacked film 10 is higher, and the read current value is lower, than in the first embodiment.

Thus, in the memory cell MC of the third embodiment, the difference in the read current value between the low resistance state and the medium resistance state is larger than in the first embodiment. Accordingly, data misread is less likely to occur.

To the stacked film 10 in the medium resistance state, furthermore, as the second energy, for instance, a pulse voltage of 0.2 V is applied for 0.1 μsec. Then, the second atoms (Al) of the third layer 23 are moved. That is, by application of the second energy, the lattice position of the second atoms (Al) in the crystal is changed.

By the movement of Al of the third layer 23 by this application of the second energy, the resistivity of the third layer 23 increases, and the resistance value of the entire stacked film 10 increases. That is, by the increase of the resistivity of the third layer 23 by application of the second energy in the medium resistance state, the stacked film 10 is changed from the medium resistance state to the high resistance state.

Thus, the third embodiment can also provide a nonvolatile semiconductor memory device capable of multilevel recording by a plurality of switching layers (second layer 22, third layer 23) allowing change (increase) of resistivity at timings different from each other.

As in the above embodiments, in the change from the medium resistance state to the high resistance state, only the resistivity of the third layer 23 increases. That is, the change of the stacked film 10 from the medium resistance state to the high resistance state depends on the change (increase) of the resistivity of the third layer 23. When the resistivity of the third layer 23 increases to the resistivity of the high resistance state, the reduction of the planar size of the third layer 23 starts to affect the resistance value of the entire stacked film 10.

That is, as shown in FIG. 4B, in the third embodiment, in the high resistance state, the resistance value of the stacked film 10 is higher, and the read current value is lower, than in the first embodiment. Thus, in the memory cell MC of the third embodiment, the difference in the read current value between the medium resistance state and the high resistance state, and the difference in the read current value between the low resistance state and the high resistance state, are larger than in the first embodiment. Accordingly, data misread is less likely to occur. Thus, according to the third embodiment, the on/off ratio can be made higher than that of the first embodiment.

According to the third embodiment, without changing the film species (resistivity) of the switching layers, the multilevel margin can be appropriately controlled by controlling the planar size.

(Fourth Embodiment)

Figure 5A:
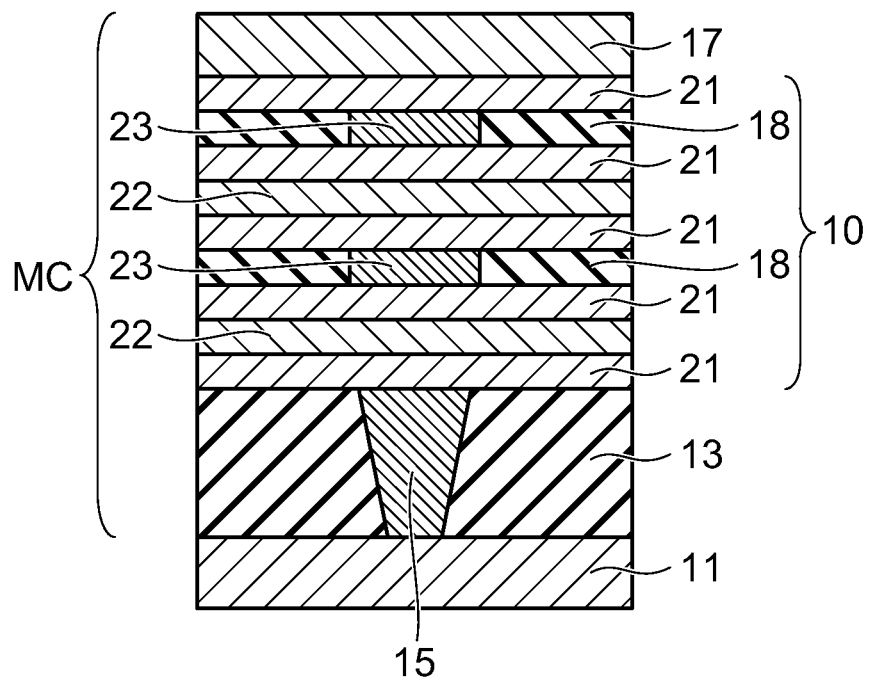
FIG. 5A is a schematic sectional view of a memory cell of a fourth embodiment.

FIG. 5A is a schematic sectional view of a memory cell MC of a fourth embodiment.

In the fourth embodiment, the planar size (diameter) of the first layer 21 is equal to the planar size (diameter) of the second layer 22. Furthermore, the planar size (diameter) of the third layer 23 is smaller than the planar size of the first layer 21 and the planar size of the second layer 22. The remaining configuration is the same as that of the first embodiment.

The center in the in-plane direction (diameter direction) of each of the first layer 21, the second layer 22, and the third layer 23 is located above the lower electrode 15. Between the first layer 21 and the first layer 21 around the third layer 23, an insulating film 18 is provided.

The stacked film 10 in this fourth embodiment is also electrically switchable to a low resistance state, a medium resistance state having a higher resistance value than the low resistance state, and a high resistance state having a higher resistance value than the medium resistance state. The stacked film 10 stores data in a nonvolatile manner. That is, the memory cell MC of the fourth embodiment is also capable of multilevel recording.

Figure 5B:
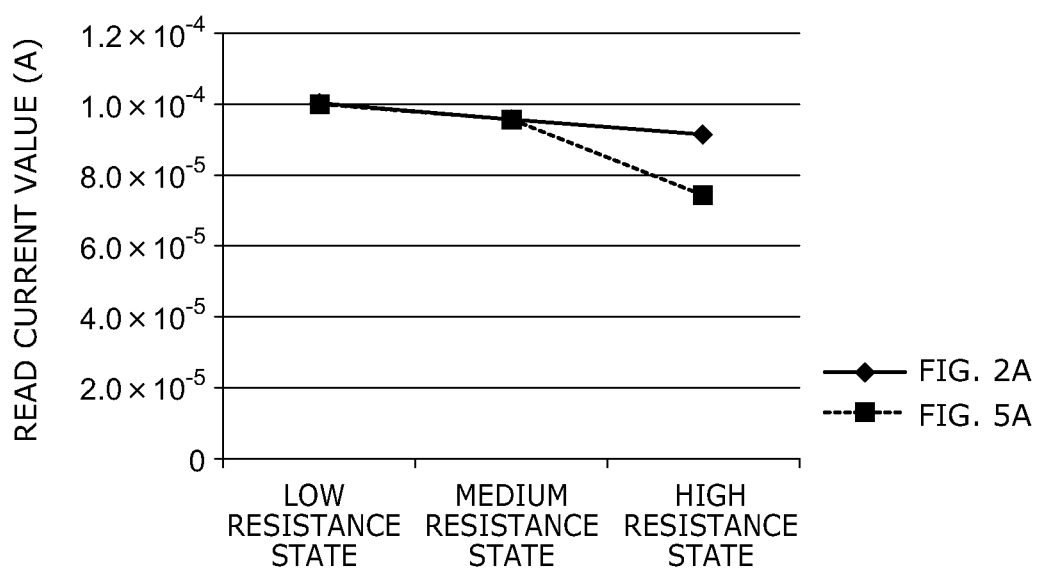
FIG. 5B is a graph showing a relationship between a phase change and a read current value in the memory cell of the fourth embodiment.

FIG. 5B is a graph showing the relationship between the phase change (resistance change) and the read current value (A) in the memory cell MC of the fourth embodiment. The resistance state on the horizontal axis represents the resistance state of the entire stacked film 10.

In FIG. 5B, the resistance change characteristic of the structure of the fourth embodiment shown in FIG. 5A is shown in comparison with the resistance change characteristic of the structure of the first embodiment shown in FIG. 2A.

In the fourth embodiment, the diameter of the first layer ($Sb_2Te_3$ layer) 21 and the second layer (GeTe layer) 22 is 100 nm. The diameter of the third layer (AlTe layer) 23 is 40 nm. The first layer 21, the second layer 22, and the third layer 23 have the same film thickness.

Also in the fourth embodiment, the resistivity of the first layer 21, the second layer 22, and the third layer 23 in each resistance state was set to the same value as in the above first embodiment to calculate the read current value shown in FIG. 5B.

Also in the fourth embodiment, as in the above embodiments, the reduction of the planar size of the third layer 23 to the extent specifically listed above by numerical values does not substantially affect the resistance value of the entire stacked film 10 in the low resistance state.

That is, in the low resistance state, the resistance value of the stacked film 10 of the fourth embodiment is substantially equal to that of the first embodiment (FIG. 2B) in which the planar size of the third layer 23 is equal to the planar size of the first layer 21.

To the stacked film 10 in this low resistance state, as the first energy, for instance, a pulse voltage of 0.1 V is applied for 0.1 μsec. Then, as in the above embodiments, the first atoms (Ge) of the second layer 22 are moved. That is, by application of the first energy, the lattice position of the first atoms (Ge) in the crystal is changed.

By the movement of Ge of the second layer 22 by this application of the first energy, the resistivity of the second layer 22 increases, and the resistance value of the entire stacked film 10 increases. That is, by the increase of the resistivity of the second layer 22 by application of the first energy in the low resistance state, the stacked film 10 is changed from the low resistance state to the medium resistance state.

In this application of the first energy, the resistivity of the first layer 21 and the third layer 23 is not substantially changed. That is, the change of the stacked film 10 from the low resistance state to the medium resistance state depends on the change (increase) of the resistivity of the second layer 22.

To the stacked film 10 in the medium resistance state, furthermore, as the second energy, for instance, a pulse voltage of 0.2 V is applied for 0.1 μsec. Then, the second atoms (Al) of the third layer 23 are moved. That is, by application of the second energy, the lattice position of the second atoms (Al) in the crystal is changed.

By the movement of Al of the third layer 23 by this application of the second energy, the resistivity of the third layer 23 increases, and the resistance value of the entire stacked film 10 increases. That is, by the increase of the resistivity of the third layer 23 by application of the second energy in the medium resistance state, the stacked film 10 is changed from the medium resistance state to the high resistance state.

Thus, the fourth embodiment can also provide a nonvolatile semiconductor memory device capable of multilevel recording by a plurality of switching layers (second layer 22, third layer 23) allowing change (increase) of resistivity at timings different from each other.

In the change from the medium resistance state to the high resistance state, only the resistivity of the third layer 23 increases. That is, the change of the stacked film 10 from the medium resistance state to the high resistance state depends on the change (increase) of the resistivity of the third layer 23. When the resistivity of the third layer 23 increases to the resistivity of the high resistance state, the reduction of the planar size of the third layer 23 starts to affect the resistance value of the entire stacked film 10.

That is, as shown in FIG. 5B, in the fourth embodiment, in the high resistance state, the resistance value of the stacked film 10 is higher, and the read current value is lower, than in the first embodiment. Thus, in the memory cell MC of the fourth embodiment, the difference in the read current value between the medium resistance state and the high resistance state, and the difference in the read current value between the low resistance state and the high resistance state, are larger than in the first embodiment. Accordingly, data misread is less likely to occur. Thus, according to the fourth embodiment, the on/off ratio can be made higher than that of the first embodiment.

According to the fourth embodiment, without changing the film species (resistivity) of the switching layers, the on/off ratio can be increased by controlling the planar size.

(Fifth Embodiment)

Figure 6A:
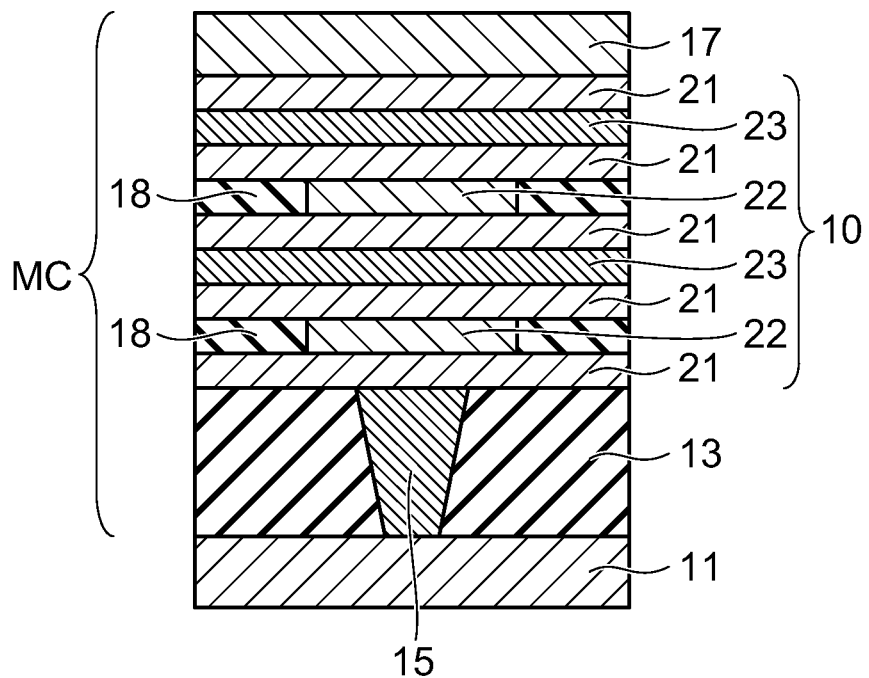
FIG. 6A is a schematic sectional view of a memory cell of a fifth embodiment.

FIG. 6A is a schematic sectional view of a memory cell MC of a fifth embodiment.

In the fifth embodiment, the planar size (diameter) of the first layer 21 is equal to the planar size (diameter) of the third layer 23. Furthermore, the planar size (diameter) of the second layer 22 is smaller than the planar size of the first layer 21 and the planar size of the third layer 23. The remaining configuration is the same as that of the first embodiment.

The center in the in-plane direction (diameter direction) of each of the first layer 21, the second layer 22, and the third layer 23 is located above the lower electrode 15. Between the first layer 21 and the first layer 21 around the second layer 22, an insulating film 18 is provided.

The stacked film 10 of this fifth embodiment is also electrically switchable to a low resistance state, a medium resistance state having a higher resistance value than the low resistance state, and a high resistance state having a higher resistance value than the medium resistance state. The stacked film 10 stores data in a nonvolatile manner. That is, the memory cell MC of the fifth embodiment is also capable of multilevel recording.

Figure 6B:
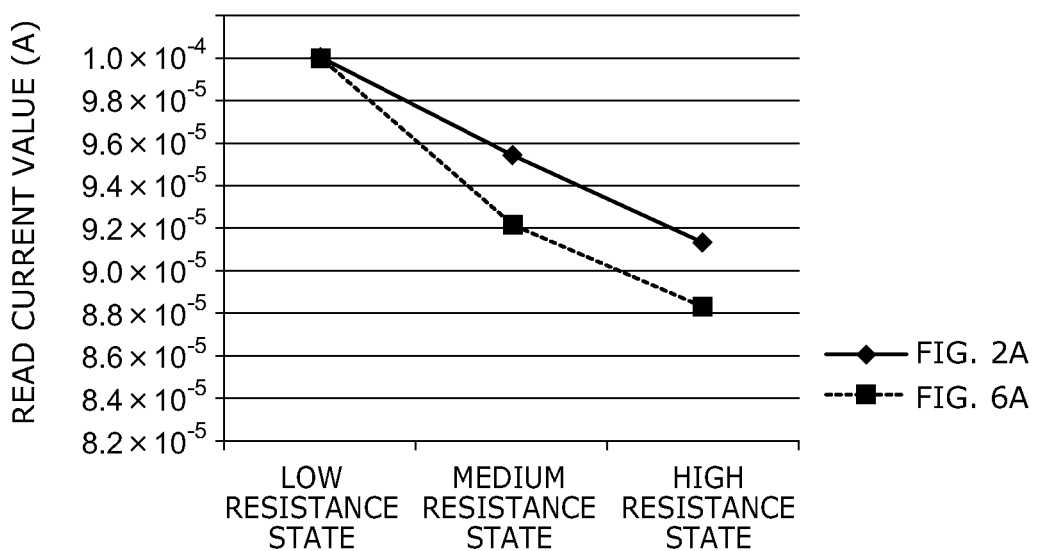
FIG. 6B is a graph showing a relationship between a phase change and a read current value in the memory cell of the fifth embodiment.

FIG. 6B is a graph showing the relationship between the phase change (resistance change) and the read current value (A) in the memory cell MC of the fifth embodiment. The resistance state on the horizontal axis represents the resistance state of the entire stacked film 10.

In FIG. 6B, the resistance change characteristic of the structure of the fifth embodiment shown in FIG. 6A is shown in comparison with the resistance change characteristic of the structure of the first embodiment shown in FIG. 2A.

In the fifth embodiment, the diameter of the first layer ($Sb_2Te_3$ layer) 21 and the diameter of the third layer (AlTe layer) 23 are 100 nm. The diameter of the second layer (GeTe layer) 22 is 75 nm. The first layer 21, the second layer 22, and the third layer 23 have the same film thickness.

Also in the fifth embodiment, the resistivity of the first layer 21, the second layer 22, and the third layer 23 in each resistance state was set to the same value as in the above first embodiment to calculate the read current value shown in FIG. 6B.

Also in the fifth embodiment, the reduction of the planar size of the second layer 22 to the extent specifically listed above by numerical values does not substantially affect the resistance value of the entire stacked film 10 in the low resistance state.

That is, in the low resistance state, the resistance value of the stacked film 10 of the fifth embodiment is substantially equal to that of the first embodiment (FIG. 2B) in which the planar size of the second layer 22 is equal to the planar size of the first layer 21.

To the stacked film 10 in this low resistance state, as the first energy, for instance, a pulse voltage of 0.1 V is applied for 0.1 μsec. Then, as in the above embodiments, the first atoms (Ge) of the second layer 22 are moved. That is, by application of the first energy, the lattice position of the first atoms (Ge) in the crystal is changed.

By the movement of Ge of the second layer 22 by this application of the first energy, the resistivity of the second layer 22 increases, and the resistance value of the entire stacked film 10 increases. That is, by the increase of the resistivity of the second layer 22 by application of the first energy in the low resistance state, the stacked film 10 is changed from the low resistance state to the medium resistance state.

In this application of the first energy, the resistivity of the first layer 21 and the third layer 23 is not substantially changed. That is, the change of the stacked film 10 from the low resistance state to the medium resistance state depends on the change (increase) of the resistivity of the second layer 22.

In the change from the low resistance state to the medium resistance state, only the resistivity of the second layer 22 increases. When the resistivity of the second layer 22 increases to the resistivity of the medium resistance state, the reduction of the planar size of the second layer 22 starts to affect the resistance value of the entire stacked film 10.

That is, as shown in FIG. 6B, in the fifth embodiment, in the medium resistance state, the resistance value of the stacked film 10 is higher, and the read current value is lower, than in the first embodiment.

Thus, in the memory cell MC of the fifth embodiment, the difference in the read current value between the low resistance state and the medium resistance state is larger than in the first embodiment. Accordingly, data misread is less likely to occur.

To the stacked film 10 in the medium resistance state, furthermore, as the second energy, for instance, a pulse voltage of 0.2 V is applied for 0.1 μsec. Then, the second atoms (Al) of the third layer 23 are moved. That is, by application of the second energy, the lattice position of the second atoms (Al) in the crystal is changed.

By the movement of Al of the third layer 23 by this application of the second energy, the resistivity of the third layer 23 increases, and the resistance value of the entire stacked film 10 increases. That is, by the increase of the resistivity of the third layer 23 by application of the second energy in the medium resistance state, the stacked film 10 is changed from the medium resistance state to the high resistance state.

Thus, the fifth embodiment can also provide a nonvolatile semiconductor memory device capable of multilevel recording by a plurality of switching layers (second layer 22, third layer 23) allowing change (increase) of resistivity at timings different from each other.

As in the above embodiments, in the change from the medium resistance state to the high resistance state, only the resistivity of the third layer 23 increases. That is, the change of the stacked film 10 from the medium resistance state to the high resistance state depends on the change (increase) of the resistivity of the third layer 23. On the other hand, the resistivity of the second layer 22 has already increased in the change from the low resistance state to the medium resistance state. Thus, the reduction of the planar size of the second layer 22 affects the resistance value of the entire stacked film 10 in the high resistance state.

That is, as shown in FIG. 6B, in the fifth embodiment, in the high resistance state, the resistance value of the stacked film 10 is higher, and the read current value is lower, than in the first embodiment. Thus, in the memory cell MC of the fifth embodiment, the difference in the read current value between the low resistance state and the high resistance state is larger than in the first embodiment. Accordingly, data misread is less likely to occur. Thus, according to the fifth embodiment, the on/off ratio can be made higher than that of the first embodiment.

According to the fifth embodiment, without changing the film species (resistivity) of the switching layers, the multilevel margin can be appropriately controlled by controlling the planar size.

By appropriately controlling the planar size of the switching layers, the multilevel margin (the difference in the read current value between the states) for enabling read determination or preventing misread can be appropriately controlled. In the following, the planar size of the first layer 21 being a non-switching layer is taken as a reference (100%), and an appropriate range of the planar size of the switching layers (second layer 22, third layer 23) is described.

The variation of the planar size of the third layer 23 contributes little to the resistance value (read current value) of the medium resistance state, but significantly affects the on/off ratio. As the planar size of the third layer 23 is made smaller, the on/off ratio increases.

Figure 10A:
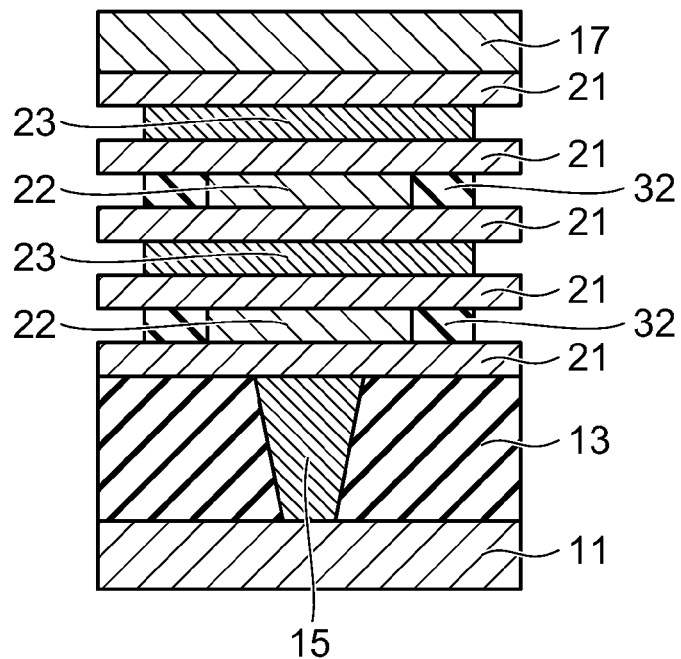
Figure 10B:
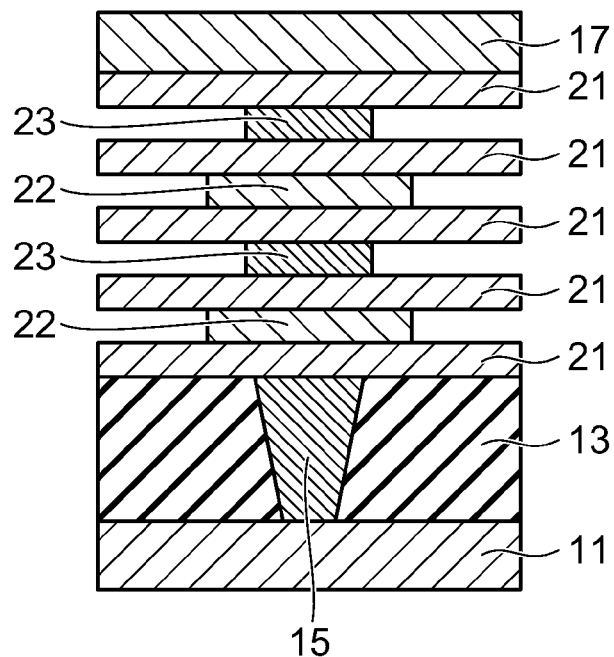

The reduction of the planar size of the third layer 23 is performed by side etching as shown in FIG. 10B described later. In this process, if the planar size of the third layer 23 is made too small, there is concern about e.g. collapse of the stacked film 10, or contact between the first layers 21 above and below the third layer 23.

Thus, for reasons of the process, the lower limit of the planar size of the third layer 23 is preferably 10% of the planar size of the first layer 21.

If the planar size of the third layer 23 is made smaller than the planar size of the first layer 21, the on/off ratio can be increased. In view of the controllability of etching stop timing in selectively side etching the third layer 23 with respect to the first layer 21, the upper limit of the planar size of the third layer 23 is preferably 90% of the planar size of the first layer 21.

Thus, the appropriate range of the planar size of the third layer 23 with reference to the first layer 21 is preferably 10-90%.

Next, the range of the planar size of the second layer 22 is described.

After the on/off ratio is determined by the planar size of the third layer 23, the planar size of the second layer 22 is determined aiming at an intermediate resistance value between the on-state (low resistance state) and the off-state (high resistance state).

In an example of three levels, the read current value in the low resistance state is taken as 100%, and the read current value in the high resistance state is taken as 0%. Then, the range of the read current value enabling read determination in the medium resistance state can be taken as 25-75%.

In the second embodiment shown in FIG. 3A, the second layer 22 is smaller in planar size than the first layer 21. The third layer 23 is smaller in planar size than the second layer 22. In this second embodiment, the combination of the planar sizes of both the second layer 22 and the third layer 23 affects the on/off ratio and the range of the read current value enabling read determination in the medium resistance state.

Specifically, with respect to the planar size of the first layer 21 (100%), the planar size of the second layer 22 can be in the range of 25-55%, and the planar size of the third layer 23 can be in the range of 10-40%. Then, any combination of the planar sizes of the second layer 22 and the third layer 23 enables read determination.

More specifically, the planar size of the second layer 22 can be set to 25%, and the planar size of the third layer 23 can be set to 10%. This provides preferable electrical characteristics. Furthermore, in view of processability, preferably, the planar size of the second layer 22 can be set to 35%, and the planar size of the third layer 23 can be set to 25%.

In the third embodiment shown in FIG. 4A, the second layer 22 and the third layer 23 are smaller in planar size than the first layer 21. The second layer 22 and the third layer 23 are equal in planar size.

In this third embodiment, with respect to the planar size of the first layer 21 (100%), the planar size of the second layer 22 and the third layer 23 in the range of 22-90% enables read determination.

More specifically, the planar size of the second layer 22 and the third layer 23 can be set to 40%. This provides preferable electrical characteristics, and superior processability.

In the fourth embodiment shown in FIG. 5A, the first layer 21 and the second layer 22 are equal in planar size. The third layer 23 is smaller in planar size than the first layer 21 and the second layer 22.

In this fourth embodiment, with respect to the planar size of the first layer 21 (100%), the planar size of the third layer 23 appropriate for obtaining a high on/off ratio is in the range of 10-90%.

More specifically, the planar size of the third layer 23 can be set to 10%. This provides preferable electrical characteristics. Furthermore, in view of processability, preferably, the planar size of the third layer 23 can be set to 40%.

In the fifth embodiment shown in FIG. 6A, the first layer 21 and the third layer 23 are equal in planar size. The second layer 22 is smaller in planar size than the first layer 21 and the third layer 23.

In this fifth embodiment, with respect to the planar size of the first layer 21 (100%), the planar size of the second layer 22 in the range of 66-90% enables read determination.

More specifically, the planar size of the second layer 22 can be set to 75%. This provides preferable electrical characteristics, and superior processability as well.

From comparison among the second embodiment shown in FIGS. 3A and 3B, the third embodiment shown in FIGS. 4A and 4B, and the fourth embodiment shown in FIGS. 5A and 5B, it is found that the difference in the read current value between the states can be made larger in the second embodiment than in the third embodiment and the fourth embodiment.

Thus, the multilevel margin can be made larger when the planar size of the second layer 22 is smaller than the planar size of the first layer 21, and the planar size of the third layer 23 is smaller than the planar size of the second layer 22.

(Sixth Embodiment)

Figure 7A:
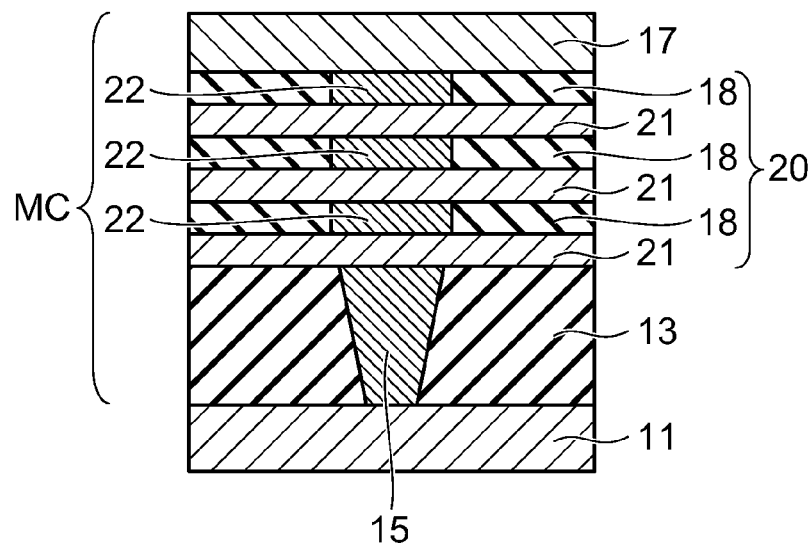
FIG. 7A is a schematic sectional view of a memory cell of a sixth embodiment.

FIG. 7A is a schematic sectional view of a memory cell MC of a sixth embodiment.

In the sixth embodiment, a stacked film 20 is provided in a columnar shape (e.g., cylindrical columnar shape) between a lower electrode 15 and an upper electrode 17. In contrast to the stacked film 10 of the above embodiments, the stacked film 20 does not include the third layer 23. The remaining configuration is the same as that of the above embodiments.

The stacked film 20 includes a plurality of first layers 21 and a plurality of second layers 22. Between the lower electrode 15 and the upper electrode 17, the first layers 21 and the second layers 22 are alternately stacked.

The planar size (diameter) of the second layer 22 is smaller than the planar size (diameter) of the first layer 21. The center in the in-plane direction (diameter direction) of each of the first layer 21 and the second layer 22 is located above the lower electrode 15.

Between the first layer 21 and the first layer 21 around the second layer 22, an insulating film 18 is provided.

The stacked film 20 in this sixth embodiment is electrically switchable to a low resistance state and a high resistance state having a higher resistance value than the low resistance state. The stacked film 20 stores data in a nonvolatile manner.

Figure 7B:
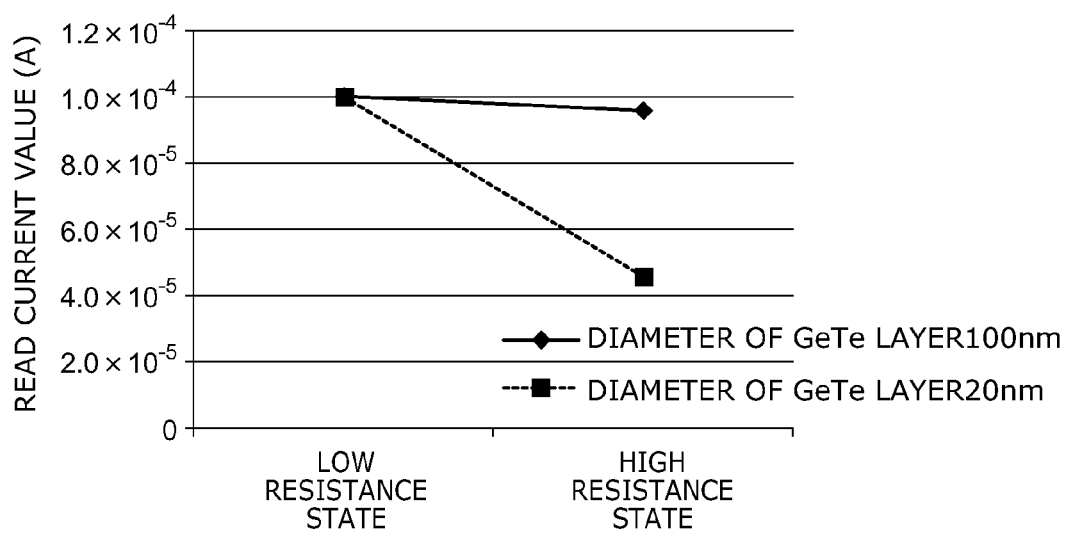
FIG. 7B is a graph showing a relationship between a phase change and a read current value in the memory cell of the sixth embodiment.

FIG. 7B is a graph showing the relationship between the phase change (resistance change) and the read current value (A) in the memory cell MC of the sixth embodiment. The resistance state on the horizontal axis represents the resistance state of the entire stacked film 20.

In the sixth embodiment, the diameter of the first layer ($Sb_2Te_3$ layer) 21 is 100 nm. The diameter of the second layer (GeTe layer) 22 is 20 nm. The first layer 21 and the second layer 22 have the same film thickness.

In FIG. 7B, the resistance change characteristic of the structure of the sixth embodiment (the diameter of the first layer 21 is 100 nm, and the diameter of the second layer 22 is 20 nm) is shown in comparison with the resistance change characteristic of a structure of a comparative example (the diameter of the first layer 21 and the diameter of the second layer 22 are both equal to 100 nm).

In the sixth embodiment, the resistivity of the first layer 21 and the second layer 22 in each resistance state was set to the following value to calculate the read current value shown in FIG. 7B.

In the low resistance state, the resistivity of the first layer 21 is $1.0 \times 10^{-4}$ $\Omega \cdot m$, and the resistivity of the second layer 22 is $1.0 \times 10^{-4}$ $\Omega \cdot m$.

In the high resistance state, the resistivity of the first layer 21 is $1.0 \times 10^{-4}$ $\Omega \cdot m$, and the resistivity of the second layer 22 is $1.0 \times 10^{-1}$ $\Omega \cdot m$.

In the low resistance state, the first layer 21 and the second layer 22 have a sufficiently low resistivity. Thus, the reduction of the planar size of the second layer 22 relative to the first layer 21 to the extent specifically listed above by numerical values does not substantially affect the resistance value of the entire stacked film 20 of the low resistance state.

That is, in the low resistance state, the resistance value of the stacked film 20 of the sixth embodiment is substantially equal to that of the comparative example in which the planar size of the second layer 22 is equal to the planar size of the first layer 21.

To the stacked film 20 in this low resistance state, as the first energy, for instance, a pulse voltage of 0.1 V is applied for 0.1 μsec. Then, the first atoms (Ge) of the second layer 22 are moved. That is, by application of the first energy, the lattice position of the first atoms (Ge) in the crystal is changed.

By the movement of Ge of the second layer 22 by this application of the first energy, the resistivity of the second layer 22 increases, and the resistance value of the entire stacked film 20 increases. That is, by the increase of the resistivity of the second layer 22 by application of the first energy in the low resistance state, the stacked film 20 is changed from the low resistance state to the high resistance state.

In this application of the first energy, the resistivity of the first layer 21 is not substantially changed. That is, the change of the stacked film 20 from the low resistance state to the high resistance state depends on the change (increase) of the resistivity of the second layer 22.

In the change from the low resistance state to the high resistance state, only the resistivity of the second layer 22 increases. When the resistivity of the second layer 22 increases to the resistivity of the high resistance state, the reduction of the planar size of the second layer 22 starts to affect the resistance value of the entire stacked film 20.

That is, as shown in FIG. 7B, in the sixth embodiment, in the high resistance state, the resistance value of the stacked film 20 is higher, and the read current value is lower, than in the comparative example.

Thus, in the memory cell MC of the sixth embodiment, the difference in the read current value between the low resistance state and the high resistance state (on/off ratio) is larger than in the comparative example. In the sixth embodiment, the on/off ratio can be made approximately 1.3 times as high as that of the comparative example.

The read current value of the high resistance state can be controlled by the planar size of the second layer 22. The reduction of the planar size of the second layer 22 increases the resistance value of the second layer 22. Thus, as the planar size of the second layer 22 is made smaller, the read current value of the high resistance state can be made smaller. That is, according to the sixth embodiment, without changing the film species (resistivity) of the switching layer (second layer 22), the on/off ratio can be increased by controlling the planar size. The increase of the on/off ratio facilitates read determination.

In the sixth embodiment, with respect to the planar size of the first layer 21 (100%), the appropriate range of the planar size of the second layer 22 is 10-90%. More specifically, the planar size of the second layer 22 can be set to 10%. This provides preferable electrical characteristics. Furthermore, in view of processability, preferably, the planar size of the second layer 22 can be set to 20%.

Next, with reference to FIGS. 8A to 10B, a method for forming the memory cell MC according to the embodiments is described.

On a substrate, not shown, a first wiring 11 is formed. The first wiring 11 is formed as a line pattern extending in a first direction on the substrate. A plurality of first wirings 11 are arranged in a second direction orthogonal to the first direction. An insulating film is embedded between the first wirings 11 adjacent in the second direction.

Figure 8A:
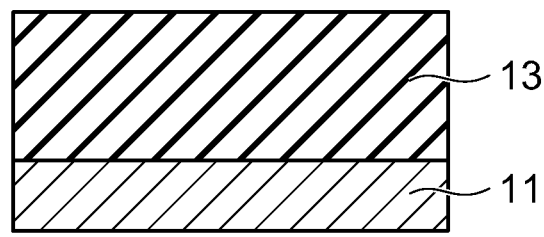
FIG. 8A, FIG. 8B, FIG. 9A, FIG. 9B, FIG. 10A and FIG. 10B are schematic sectional views showing a method for manufacturing the memory cell of the embodiment.

On the first wirings 11 and on the insulating film between the first wirings 11, as shown in FIG. 8A, an insulating film 13 is formed. The insulating film 13 is e.g. a silicon oxide film.

Figure 8B:
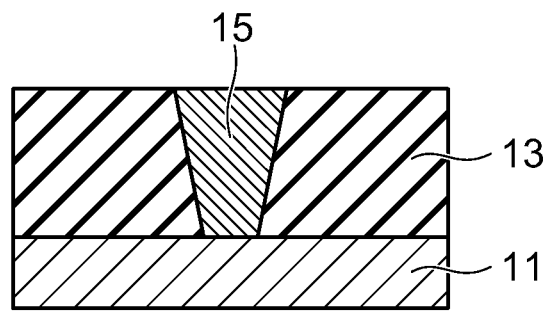

In the insulating film 13, a via hole reaching the first wiring 11 is formed. In the via hole, as shown in FIG. 8B, titanium nitride (TiN), for instance, is embedded as a lower electrode 15. The upper surface of the lower electrode 15 and the upper surface of the insulating film 13 are planarized. The upper surface of the lower electrode 15 is exposed from the insulating film 13.

Figure 9A:
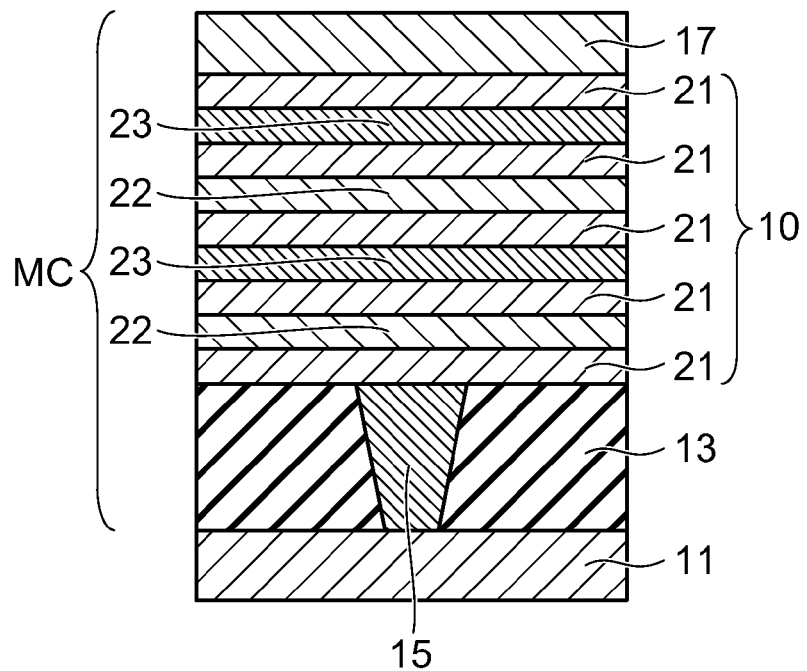

Next, on the upper surface of the lower electrode 15 and the upper surface of the insulating film 13, as shown in FIG. 9A, a stacked film 10 is stacked. Furthermore, on the stacked film 10, an upper electrode 17 is stacked.

Next, by using a resist mask, not shown, the stacked body including the upper electrode 17 and the stacked film 10 is processed into a cylindrical columnar shape by e.g. RIE (reactive ion etching) technique.

Thus, a memory cell MC of the first embodiment shown in FIG. 2A is formed.

Then, side etching can be performed on the switching layers (second layer 22, third layer 23) to form a structure in which the switching layers are made smaller in planar size than the first layer 21.

For instance, a method for forming the stacked film 10 of the second embodiment is described below. In this stacked film 10, the planar size of the second layer (GeTe layer) 22 is larger than the planar size of the third layer (AlTe layer) 23, and the planar size of the first layer ($Sb_2Te_3$ layer) 21 is larger than the planar size of the second layer (GeTe layer) 22.

After processing the memory cell MC into a columnar shape (e.g., cylindrical columnar shape), the outer peripheral side portion of the second layer 22 and the outer peripheral side portion of the third layer 23 are oxidized.

Figure 9B:
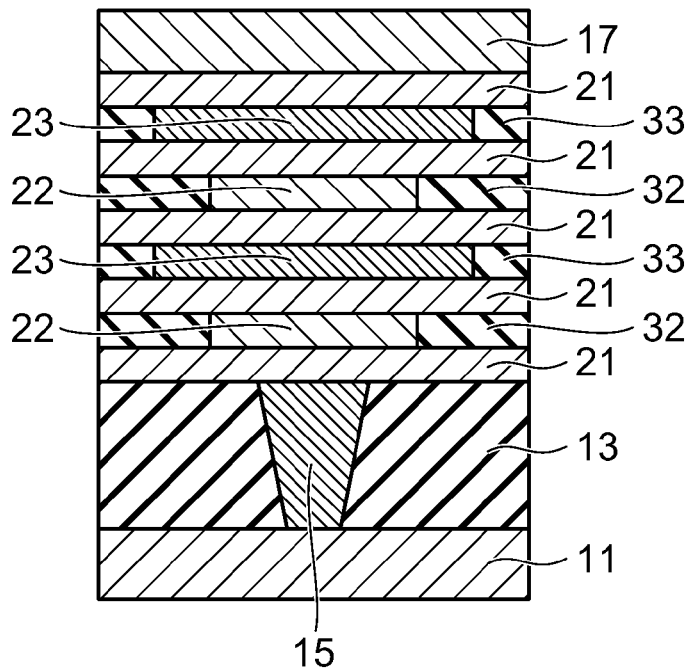

Oxidation proceeds from the outer peripheral surface of the second layer 22 and the outer peripheral surface of the third layer 23. As shown in FIG. 9B, a GeTe oxide film 32 is formed on the outer peripheral side portion of the second layer 22, and an AlTe oxide film 33 is formed on the outer peripheral side portion of the third layer 23.

Here, the oxidation rate of GeTe is faster than the oxidation rate of AlTe. The oxidation rate of $Sb_2Te_3$ is sufficiently slower than the oxidation rate of GeTe and the oxidation rate of AlTe. Thus, without substantially oxidizing the first layer 21, the second layer 22 and the third layer 23 can be selectively oxidized. Furthermore, in the second layer 22, oxidation proceeds more deeply to the center side in the in-plane direction (diameter direction) than in the third layer 23.

Then, under the condition allowing the oxidation film to be selectively etched, side etching is performed on the stacked film 10. Here, any of wet etching and dry etching can be used.

The oxide film 32 of the second layer 22 and the oxide film 33 of the third layer 23 are isotropically etched. The amount of oxidation is larger in the second layer 22 than in the third layer 23. Thus, when the oxide film 33 of the third layer 23 is removed and the side surface of the third layer 23 is exposed, the oxide film 32 still remains on the outer peripheral side of the second layer 22.

Then, the etching condition is changed, and side etching is performed on the third layer (AlTe layer) 23 at a faster rate than on the oxide film 32. As a result, when the oxide film 32 of the second layer 22 is removed, side etching has proceeded more deeply to the center side in the third layer 23 than in the second layer 22. As shown in FIG. 10B, this results in a structure in which the planar size of the second layer 22 is smaller than the planar size of the first layer 21, and the planar size of the third layer 23 is smaller than the planar size of the second layer 22.

Then, as shown in FIG. 3A, in the gap formed by the side etching of the second layer 22 and the third layer 23, a silicon oxide film, for instance, is embedded as an insulating film 18.

Here, before forming the insulating film 18, the exposed side surface of the stacked film 10 can be covered and protected with a protective film such as a silicon nitride film.

Thus, the switching layer to be etched is oxidized beforehand, and then side etching is performed on the oxide film. This can improve the controllability of the amount of etching.

Alternatively, without oxidizing the switching layer to be etched, side etching can be directly performed by wet or dry technique. Depending on the film species of the switching layer, an appropriate etching condition can be specified. Thus, without substantially etching the first layer 21, a difference can be provided between the etching rates of a plurality of switching layers.

In a stacked film of a superlattice structure, examples of atoms reversibly moved by energy application can include germanium (Ge), aluminum (Al), gallium (Ga), indium (In), tin (Sn), zinc (Zn), silver (Ag), gold (Au), and copper (Cu).

For instance, in the case of using a GeTe layer and a $Ga_2Te_3$ layer as switching layers, by energy application in the low resistance state, the resistivity of the GeTe layer is increased (switched) earlier. That is, the GeTe layer corresponds to the second layer 22, and the $Ga_2Te_3$ layer corresponds to the third layer 23.

In the case of using an $In_2Te_3$ layer and a GeTe layer as switching layers, by energy application in the low resistance state, the resistivity of the $In_2Te_3$ layer is increased (switched) earlier. That is, the $In_2Te_3$ layer corresponds to the second layer 22, and the GeTe layer corresponds to the third layer 23.

In the case of using a GeTe layer and a SnTe layer as switching layers, by energy application in the low resistance state, the resistivity of the GeTe layer is increased (switched) earlier. That is, the GeTe layer corresponds to the second layer 22, and the SnTe layer corresponds to the third layer 23.

In the case of using an $In_2Te_3$ layer and a SnTe layer as switching layers, by energy application in the low resistance state, the resistivity of the $In_2Te_3$ layer is increased (switched) earlier. That is, the $In_2Te_3$ layer corresponds to the second layer 22, and the SnTe layer corresponds to the third layer 23.

The first layer 21 capable of forming a superlattice with these switching layers can be made of a material of a hexagonal crystal having a low crystallization temperature. For instance, the first layer 21 can be a $Sb_2Te_3$ layer, $Bi_2Te_4$ layer, or SbBiTe layer.

The switching timing between a plurality of switching layers depends not only on the composition of the film but also on the film thickness, planar size and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A memory device comprising:
   a stacked film stacked in a superlattice structure and including a first layer, a second layer, and a third layer different in composition,
   the first layer being provided between the second layer and the third layer,
   the second layer including a first atom configured to reversibly move by application of energy, and
   the third layer including a second atom configured to reversibly move by application of energy and being different from the first atom.

2. The device according to claim 1, wherein a planar size of the second layer is smaller than a planar size of the first layer.

3. The device according to claim 1, wherein a planar size of the third layer is smaller than a planar size of the first layer.

4. The device according to claim 1, wherein a planar size of the second layer and a planar size of the third layer are smaller than a planar size of the first layer.

5. The device according to claim 4, wherein the planar size of the third layer is smaller than the planar size of the second layer.

6. The device according to claim 1, wherein the first layer, the second layer, and the third layer are formed from chalcogenide compounds including tellurium.

7. The device according to claim 6, wherein the second layer includes, as the first atom, at least one of germanium, aluminum, gallium, indium, tin, zinc, silver, gold, and copper.

8. The device according to claim 6, wherein the third layer includes, as the second atom, at least one of germanium, aluminum, gallium, indium, tin, zinc, silver, gold, and copper.

9. The device according to claim 6, wherein the first layer includes at least one of antimony and bismuth.

10. The device according to claim 1, wherein the stacked film is configured to change to a low resistance state, a medium resistance state having a higher resistance value than the low resistance state, and a high resistance state having a higher resistance value than the medium resistance state.

11. The device according to claim 10, wherein in the low resistance state, a resistivity of the second layer is higher than a resistivity of the third layer.

12. The device according to claim 10, wherein when a first energy is applied to the stacked film in the low resistance state, the first atom of the second layer is configured to move to increase a resistivity of the second layer, and the stacked film is configured to change from the low resistance state to the medium resistance state.

13. The device according to claim 12, wherein when a second energy is applied to the stacked film in the medium resistance state, the second atom of the third layer is configured to move to increase a resistivity of the third layer, and the stacked film is configured to change from the medium resistance state to the high resistance state.

14. The device according to claim 1, further comprising:
    a first wiring, and a second wiring crossing the first wiring,
    wherein the stacked film is provided in a columnar shape between the first wiring and the second wiring.

* * * * *